(12) United States Patent
Xu et al.

(10) Patent No.: US 10,707,115 B2
(45) Date of Patent: Jul. 7, 2020

(54) DRY FIN REVEAL WITHOUT FIN DAMAGE

(71) Applicant: INTERNATIONAL BUSINESS MACHINES CORPORATION, Armonk, NY (US)

(72) Inventors: Peng Xu, Santa Clara, CA (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/906,583

(22) Filed: Feb. 27, 2018

(65) Prior Publication Data
US 2019/0267280 A1  Aug. 29, 2019

(51) Int. Cl.
| | |
|---|---|
| *H01L 21/762* | (2006.01) |
| *H01L 21/311* | (2006.01) |
| *H01L 29/66* | (2006.01) |
| *H01L 21/308* | (2006.01) |
| H01L 21/306 | (2006.01) |
| H01L 21/3065 | (2006.01) |

(52) U.S. Cl.
CPC .... *H01L 21/76224* (2013.01); *H01L 21/3083* (2013.01); *H01L 21/31111* (2013.01); *H01L 21/31116* (2013.01); *H01L 29/66795* (2013.01); *H01L 21/3065* (2013.01); *H01L 21/30604* (2013.01); *H01L 21/31122* (2013.01)

(58) Field of Classification Search
CPC ....... H01L 21/823431; H01L 21/31116; H01L 29/66818; H01L 21/31111; H01L 21/3083; H01L 29/66795; H01L 21/76224; H01L 21/3065; H01L 21/31122; H01L 21/30604
See application file for complete search history.

(56) References Cited

U.S. PATENT DOCUMENTS

| | | | |
|---|---|---|---|
| 5,960,318 A | 9/1999 | Peschke et al. | |
| 7,084,025 B2 | 8/2006 | Phua et al. | |
| 8,633,076 B2 | 1/2014 | Wang et al. | |
| 8,809,932 B2 | 8/2014 | Cho et al. | |
| 8,906,760 B2 | 12/2014 | Ranjan et al. | |
| 9,142,402 B2 * | 9/2015 | Liou | H01L 21/76224 |
| 9,293,345 B2 | 3/2016 | He et al. | |
| 9,461,146 B1 | 10/2016 | Cheng et al. | |
| 9,502,569 B2 * | 11/2016 | Zhao | H01L 29/7853 |
| 9,543,441 B2 | 1/2017 | Lee et al. | |
| 9,559,014 B1 * | 1/2017 | Basker | H01L 29/66803 |
| 9,711,618 B1 * | 7/2017 | Cheng | H01L 29/66545 |
| 9,735,154 B2 | 8/2017 | Wei et al. | |

(Continued)

*Primary Examiner* — Savitri Mulpuri
(74) *Attorney, Agent, or Firm* — Tutunjian & Bitetto, P.C.; Vazken Alexanian

(57) ABSTRACT

A method is presented for preventing fin erosion. The method includes forming a plurality of hardmasks over a plurality of fin structures, trimming the plurality of fin structures such that the plurality of hardmasks are wider than the plurality of fin structures, forming a dielectric liner adjacent sidewalls of the plurality of fin structures, and depositing a dielectric between the plurality of fin structures. The method further includes directionally etching the dielectric to form recesses between the plurality of fin structures and isotropically etching dielectric remaining regions directly underneath the plurality of hardmasks such that upper corners of the plurality of fin structures remain in an undamaged state.

20 Claims, 10 Drawing Sheets

(56) References Cited

U.S. PATENT DOCUMENTS

| | | | |
|---|---|---|---|
| 9,735,246 B1* | 8/2017 | Basker | H01L 29/42392 |
| 9,754,798 B1 | 9/2017 | Bi et al. | |
| 9,929,152 B2* | 3/2018 | Anderson | H01L 27/088 |
| 10,177,146 B2* | 1/2019 | Li | H01L 27/0886 |
| 2013/0307079 A1 | 11/2013 | Jagannathan et al. | |
| 2016/0126353 A1* | 5/2016 | Jacob | H01L 29/7851 257/192 |
| 2016/0247731 A1* | 8/2016 | Balakrishnan | H01L 21/3083 |
| 2016/0293736 A1* | 10/2016 | Cheng | H01L 21/02178 |
| 2017/0352541 A1* | 12/2017 | Hsu | H01L 21/02636 |
| 2018/0090367 A1* | 3/2018 | Bi | H01L 29/0649 |
| 2018/0090384 A1* | 3/2018 | Bi | H01L 29/0649 |
| 2018/0090385 A1* | 3/2018 | Bi | H01L 29/0649 |
| 2018/0226291 A1* | 8/2018 | Hsu | H01L 21/823431 |

* cited by examiner

DRY FIN REVEAL WITHOUT FIN DAMAGE

BACKGROUND

Technical Field

The present invention relates generally to semiconductor devices, and more specifically, to preventing fin corner erosion during semiconductor manufacturing.

Description of the Related Art

In recent years, with increases in the degree of integration, functionality, and speed of semiconductor devices, there is an increasing demand for miniaturization of semiconductor devices. To meet the demand, various device structures have been proposed for reducing an area occupied by transistors over a substrate. Among them, a field effect transistor (FET) having a fin-type structure has drawn attention. The FET having the fin-type structure is generally called a fin field effect transistor (FinFET), and has an active region made of a semiconductor region having a thin-wall (fin) shape perpendicular to the principal surface of a substrate. In the FinFET, the side surfaces of the fin-type semiconductor region can be used as channel surfaces, and accordingly the area occupied by transistors over the substrate can be reduced.

SUMMARY

In accordance with an embodiment, a method is provided for preventing fin erosion during semiconductor processing. The method includes forming a plurality of hardmasks over a plurality of fin structures, trimming the plurality of fin structures such that the plurality of hardmasks are wider than the plurality of fin structures, forming a dielectric liner adjacent sidewalls of the plurality of fin structures, and depositing a dielectric between the plurality of fin structures. The method further includes etching the dielectric to form recesses between the plurality of fin structures and isotropically etching dielectric remaining directly underneath the plurality of hardmasks such that upper corners of the plurality of fin structures remain in an undamaged state.

In accordance with another embodiment, a method is provided for maintaining geometric integrity of corners of fin structures. The method includes forming hardmasks over the fin structures, the hardmasks being wider than the fin structures, directionally etching a dielectric deposited between the fin structures to form recesses therebetween, the directional etching defining first dielectric regions and second dielectric regions, and isotropically etching the second dielectric regions remaining directly underneath the hardmasks such that the corners of the fin structures remain in an undamaged state.

In accordance with yet another embodiment, a method is provided for preventing fin corner erosion during a fin field-effect transistor (FinFET) shallow trench isolation (STI) recess. The method includes forming hardmasks over fin structures, the hardmasks being wider than the fin structures, forming a dielectric liner adjacent sidewalls of the fin structures, depositing an STI oxide between the plurality of fin structures, directionally etching a first portion of the STI oxide to form recesses between the fin structures, and isotropically etching a second portion of the STI oxide remaining directly underneath the hardmasks such that upper corners of the fin structures remain intact.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
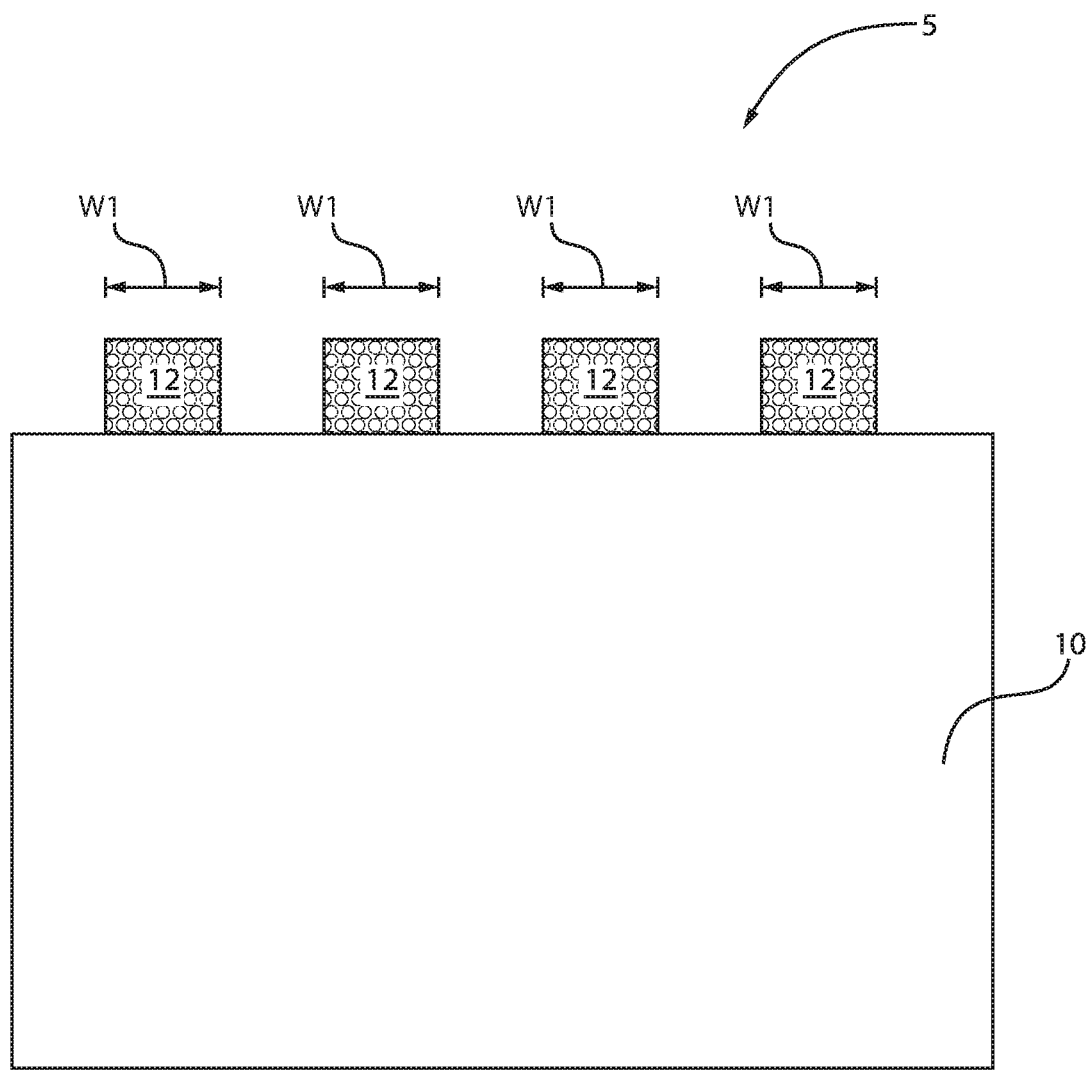
FIG. 1 is a cross-sectional view of a semiconductor structure including a fin hardmask pattern formed on a semiconductor substrate, in accordance with an embodiment of the present invention.

Embodiments in accordance with the present invention provide methods and devices for implementing fin reveal processes to preserve or maintain an undamaged state for fins formed over a semiconductor substrate. Removal of a dielectric material to expose a hard mask and/or fins is referred to as a fin reveal. The fin reveal can include a planarization process and/or one or more etching processes. The dielectric material can be recessed to form a shallow trench isolation (STI) region at the base of the fins. Fin reveal processes can employ a wet etch and a dielectric etch to reveal fins. A dry fin reveal process can be employed to achieve depth uniformity across the different fin density regions or different film quality regions.

In particular, fin reveal processes can employ, e.g., a buffered hydrogen fluoride (HF) etch process (wet etch) and a directional oxide removal etch (oxide etch) to reveal fins through an oxide layer during fin field effect transistor manufacturing. The wet etch process can etch dense fin regions (dense regions) at a faster etch rate while the directional oxide removal etch process can etch isolated fin regions (iso regions) at a faster etch rate. The wet etch process performs most of the material removal during the fin reveal, and the directional oxide removal process can tune the iso region fin reveal depth to attempt to match the fin reveal depth in the dense region. The etch rate of the wet etch (e.g., HF) is very sensitive to oxide material quality and volume. When the oxide layer (e.g., shallow trench isolation (STI) material) changes or includes fin pitch changes, the fin reveal process needs to be re-tuned to provide a good balance between iso region and dense region differences.

Embodiments in accordance with the present invention provide methods and devices for preventing fin erosion during semiconductor processing/manufacturing. Upper corner fin erosion can be prevented by employing a fin hardmask that is wider than the fin. A two-step recess process can be performed to protect the upper corners of the fin from erosion or other damage. The first step includes a directional etch that recesses shallow trench isolation (STI) oxide by employing a wider fin hardmask to shield or protect the corners of the fins. The second step includes a selective isotropic etch that removes the STI oxide remaining underneath the fin hardmask.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a fin hardmask pattern formed on a semiconductor substrate, in accordance with an embodiment of the present invention.

The semiconductor structure 5 includes a substrate 10 and a plurality of fin hardmasks 12 formed thereon. Each of the hardmasks 12 has a width "W1." The width "W1" is greater than the eventual width or thickness of the fins. Due to corner erosion that can occur at end portions of each fin during semiconductor processing/manufacturing, end walls of each fin can develop a tapered vertical profile. In other words, the vertical profile of each fin within a vertical plane extending along the lengthwise direction of the fin can become trapezoidal (or rounded) in nature during semiconductor processing/manufacturing. The selected or chosen width "W1" of the hardmasks 12 can prevent such corner erosion as described further below. Stated differently, the width or thickness of the fin hardmask 12 is intentionally set to be larger than the target width or thickness of the fin to prevent damage to corners of the fins.

The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation. The semiconductor substrate 10 can be doped, undoped or include doped regions and undoped regions therein. The semiconductor substrate 10 can include regions with strain and regions without strain therein, or include regions of tensile strain and compressive strain. In some embodiments, the substrate 10 includes other device structures (not shown) such as transistors, isolation structures (such as shallow trench isolations), contacts, conducting wires, etc.

The hardmask 12 can be manufactured of silicon nitride (SiN), deposited using, for example, low pressure chemical vapor deposition (LPCVD). In other example embodiments, the hardmask 12 can include, but is not limited to, hafnium oxide ($HfO_2$) or tantalum nitride (TaN) or silicon nitride (SiN). In some embodiments, the hardmask 12 can include multiple layers, for example, silicon nitride on top of silicon oxide.

Figure 2:
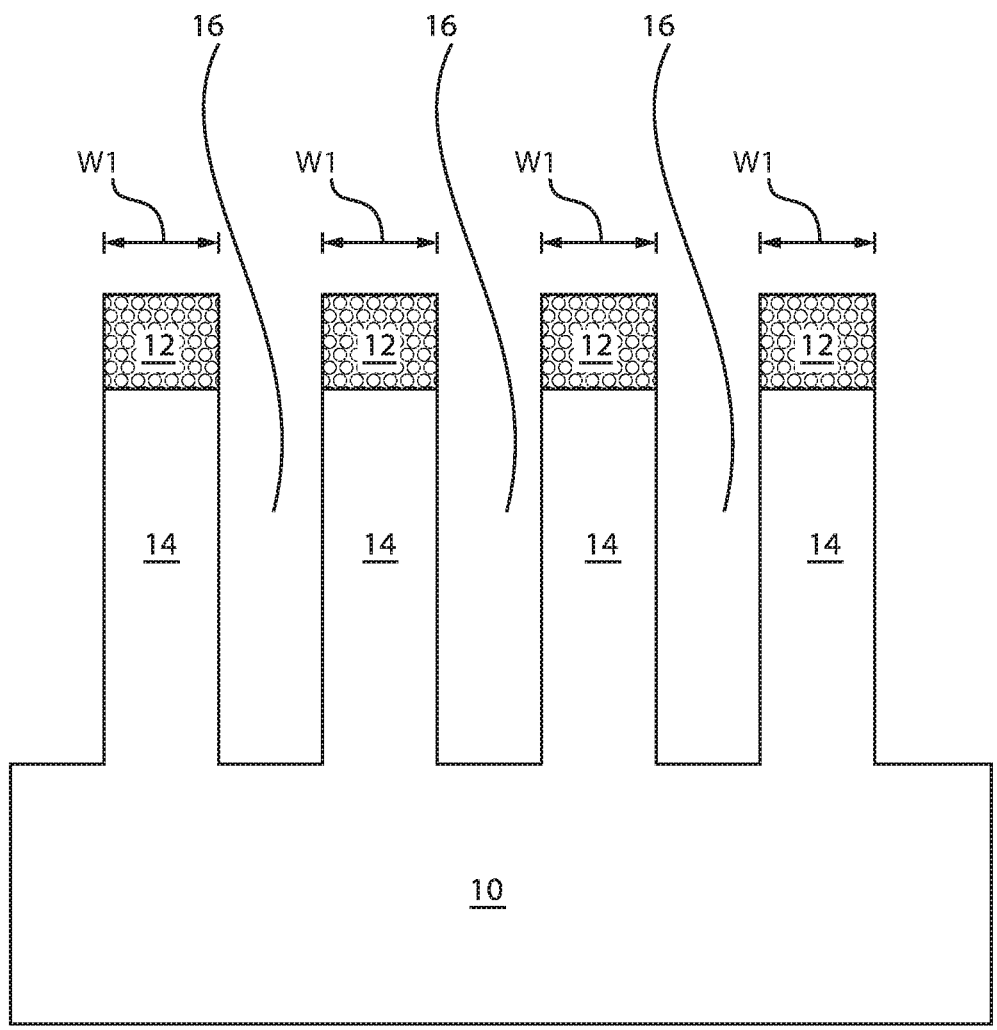
FIG. 2 is a cross-sectional view of the semiconductor structure of FIG. 1 where the semiconductor structure is etched to form a plurality of fins, in accordance with an embodiment of the present invention.

FIG. 2 is a cross-sectional view of the semiconductor structure of FIG. 1 where the semiconductor structure is etched to form a plurality of fins, in accordance with an embodiment of the present invention.

In various exemplary embodiments, the substrate 10 is etched to form channels or troughs 16 between the plurality of fins 14. The plurality of fins 14 have a width equal to the width of the hardmask 12, which is width "W1."

The plurality of fin structures 14 are formed from the substrate 10, which includes a semiconductor material including, but not limited to Si, strained Si, SiC, SiGe, SiGeC, Si alloys, Ge, Ge alloys, GaAs, InAs, InP as well as other III/V and II/VI compound semiconductors. The plurality of fin structures 14 are etched using a reactive ion etch (RIE) or the like. The etching can include a dry etching process such as, for example, reactive ion etching, plasma etching, ion etching or laser ablation. The etching can further include a wet chemical etching process in which one or more chemical etchants are employed to remove portions of the layers.

The plurality of fins 14 can be referred to as "fat" fins. The plurality of fins 14 are referred to as "fat" because at this point of semiconductor processing they are not set to the eventual target width or thickness. The plurality of fins 14 can be, e.g., silicon (Si) fins. In another exemplary embodiment, the plurality of fins 14 can be, e.g., silicon germanium (SiGe) fins. Yet in another exemplary embodiment, some of fins 14 can be a material that is different from the other fins. For example, some fins can be silicon fins while others can be silicon germanium (SiGe) fins. One skilled in the art can contemplate forming fins 14 from any type of materials.

Figure 3:
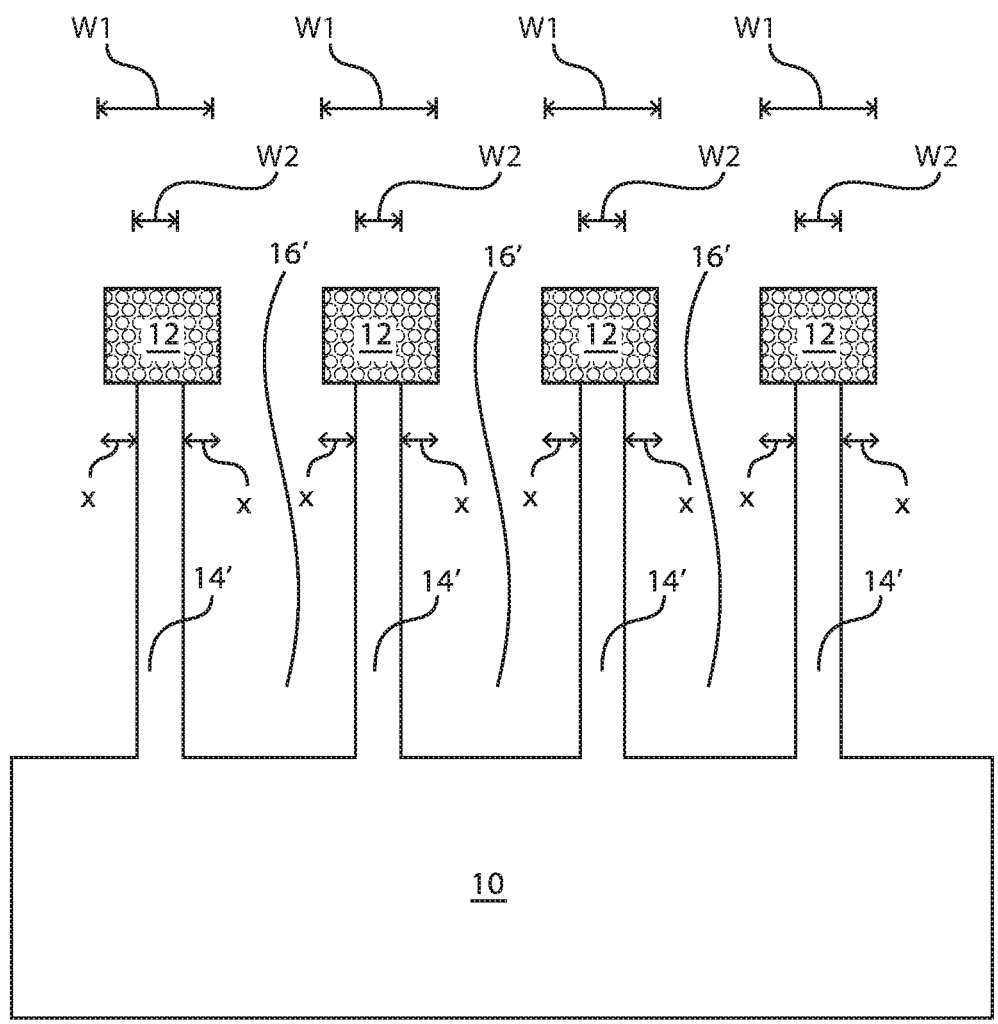
FIG. 3 is a cross-sectional view of the semiconductor structure of FIG. 2 where the channel of the plurality of fins is trimmed, in accordance with an embodiment of the present invention.

FIG. 3 is a cross-sectional view of the semiconductor structure of FIG. 2 where the channel of the plurality of fins is trimmed, in accordance with an embodiment of the present invention.

In various exemplary embodiments, the plurality of fins 14 are trimmed to a width "W2," which is less than the width "W1" of the hardmasks 12. The thinner plurality of fins are now designated as 14'. Additionally, the channel or troughs between the plurality of fins 14' are now designated as 16'. The plurality of hardmasks 12 act as an umbrella or shield over the plurality of fins 14'. The plurality of hardmasks 12 extend a distance "x" beyond the sidewalls of the plurality of fins 14'. In one example embodiment, the width "x" can be approximately equal to the width "W2" of the fins 14'. Therefore, the hardmask 12 can extend a distance "x" beyond the sidewalls of the fin 14' that is equal to the width or thickness of the fin 14'. Of course, one skilled in the art can contemplate extending the hardmask 12 a distance greater than the width or thickness of the fin 14' in order to shield or protect the upper corners of the fin 14'. In another non-limiting example, the extension of the hardmask 12 on each side of the fin 14' can be greater than 3 nm. The thickness of the fin 14' can be, e.g., between about 3 nm and about 15 nm. In a preferred embodiment, the thickness of the fin 14' can be, e.g., between about 5 nm and about 10 nm.

The plurality of fins 14' are trimmed by, e.g., a wet etch that can be performed to expand openings 16 into openings 16'. The wet etching can be performed, for example, using ammonia (NH4OH), Tetra-Methyl Ammonium Hydroxide (TMAH), solution, or the like. In some embodiments, the fin trimming process is performed by an isotropic etch. For example, plasma etch including chlorine can be used to trim silicon or silicon germanium fins. In other embodiments, the fin trimming is performed by using an oxidation process to convert a portion of semiconductor fins into oxide. The formed oxide is then striped by oxide etch, e.g., by hydrogen fluoride acid (HF) solution or chemical oxide etch (COR).

Figure 4:
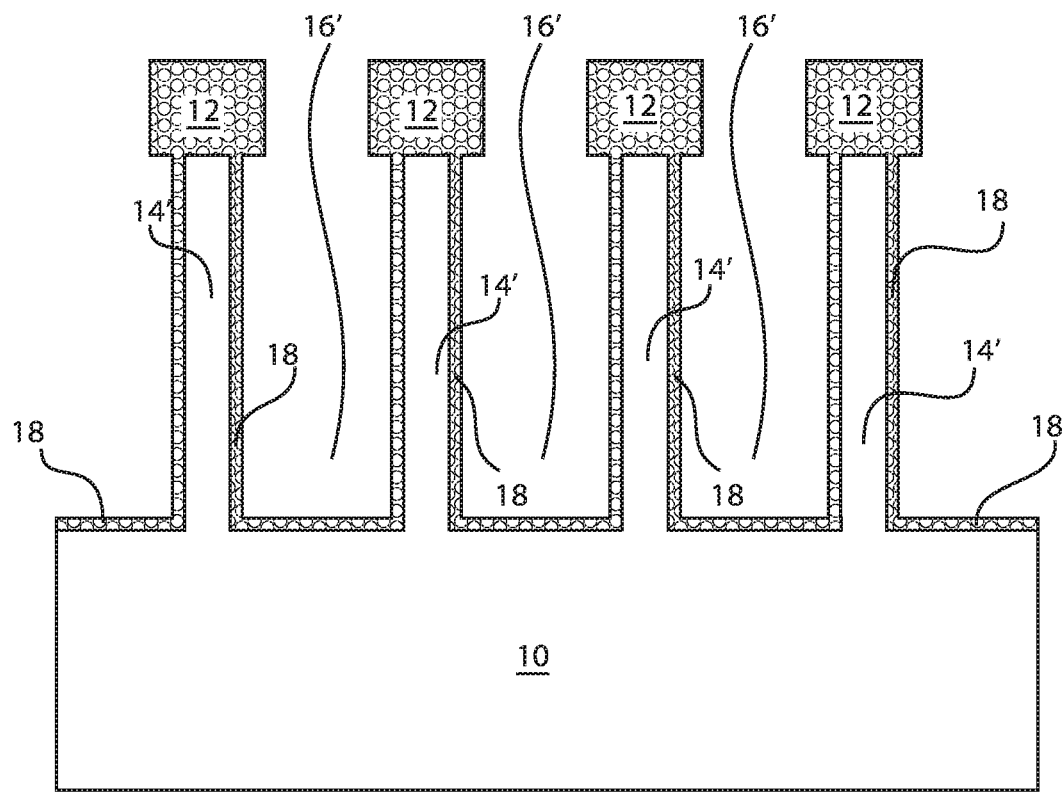
FIG. 4 is a cross-sectional view of the semiconductor structure of FIG. 3 where a dielectric liner is deposited, in accordance with an embodiment of the present invention.

FIG. 4 is a cross-sectional view of the semiconductor structure of FIG. 3 where a dielectric liner is deposited, in accordance with an embodiment of the present invention.

In various exemplary embodiments, a dielectric liner 18 is deposited adjacent the sidewalls of the plurality of fins 14', as well as within the channels 16' formed between the plurality of fins 14'. The dielectric liner 18 is not formed over or adjacent the sidewalls of the hardmasks 12.

The dielectric liner 18 can include an oxide, nitride or oxynitride material layer. In one example, when the dielectric liner 18 includes an oxide, the dielectric liner 18 can include silicon oxide ($SiO_2$). In another example, when the dielectric liner 18 includes a nitride, the dielectric liner 18 can include silicon nitride (SiN). In some embodiments, the dielectric liner 18 can include a low-k dielectric material (e.g., SiON, SiOCN, SiOC, SiBCN). In another example, the dielectric liner 18 includes more than one layer of materials, for example, an oxide layer on fin sidewalls followed by nitride layer on oxide layer. The dielectric liner 18 can be formed by thermal oxidation, plasma oxidation, ozone oxidation, thermal nitridation, plasma nitridation, chemical vapor deposition (CVD), plasma enhanced chemical vapor deposition (PECVD), physical vapor deposition (PVD), high-density plasma CVD. In one example embodiment, the dielectric liner 18 can have a thickness of about 2 nanometers (nm) to about 20 nm, or about 5 nm to about 10 nm. In some embodiments, the liner is optional.

Figure 5:
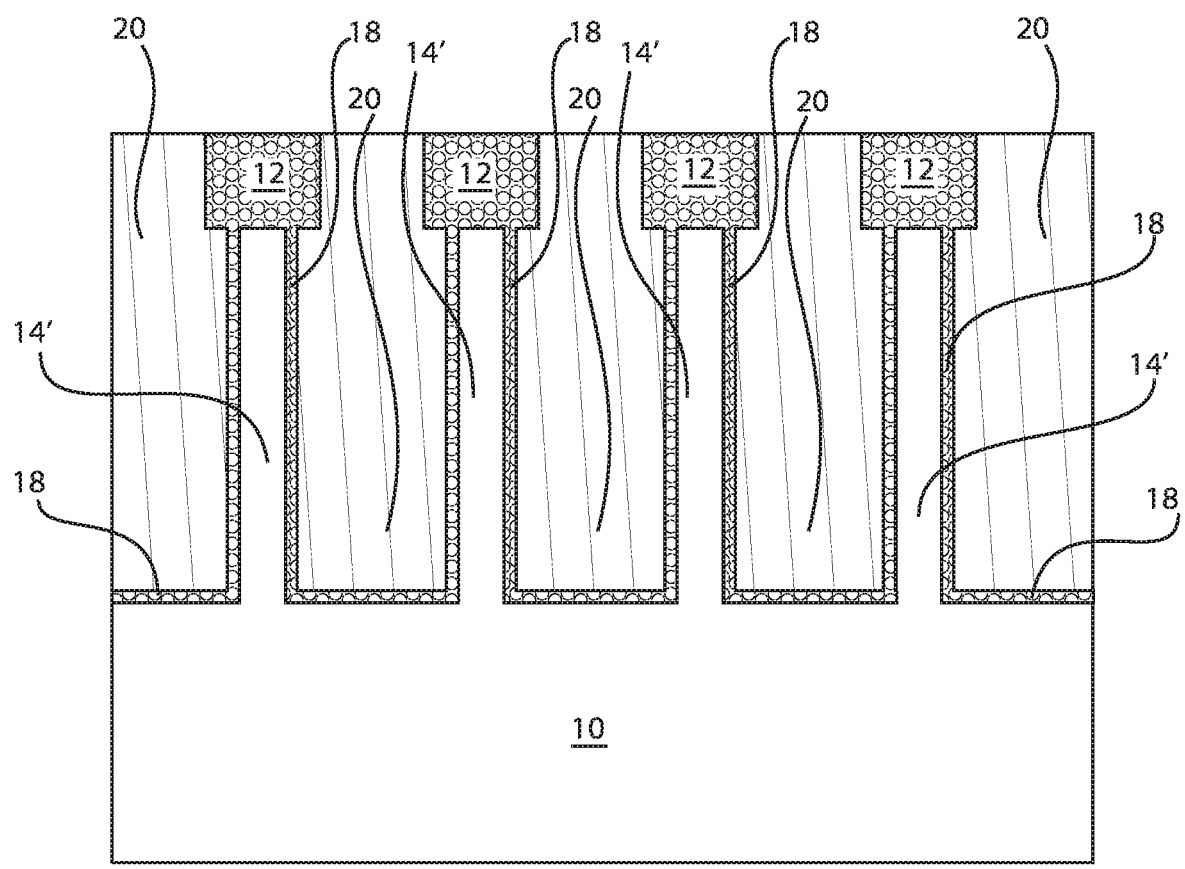
FIG. 5 is a cross-sectional view of the semiconductor structure of FIG. 4 where a dielectric fill takes place, in accordance with an embodiment of the present invention.

FIG. 5 is a cross-sectional view of the semiconductor structure of FIG. 4 where a dielectric fill takes place, in accordance with an embodiment of the present invention.

In various exemplary embodiments, additional dielectric 20 can be formed between the plurality of fins 14' and over the hardmasks 12. The additional dielectric 20 contacts the sidewalls of the dielectric liner 18 as well as the sidewalls of the hardmask 12 after planarization. The additional dielectric 20 is fully formed within the channels 16' defined between the plurality of fins 14'. Suitable dielectric materials for forming the additional dielectric 20 include but are not limited to, silicon oxide, silicon nitride, silicon oxynitride, SiCO, SiCON, or any suitable combination of such materials. The additional dielectric 20 can be formed any suitable process, including but not limited to, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), physical vapor deposition (PVD), sputtering, plating, evaporation, spin-on-coating, ion beam deposition, electron beam deposition, laser assisted deposition, chemical solution deposition, or any combination of those methods.

In various exemplary embodiments, a height of the additional dielectric 20 can be reduced by chemical-mechanical polishing (CMP) and/or etching. Therefore, the planarization process can be provided by CMP. Other planarization processes can include grinding and polishing. The planarization of additional dielectric 20 results in a top surface 13 (FIGS. 6 and 7) of the hardmasks 12 being exposed. The additional dielectric 20 can also be referred to as an STI oxide in one or more embodiments.

Figure 6:
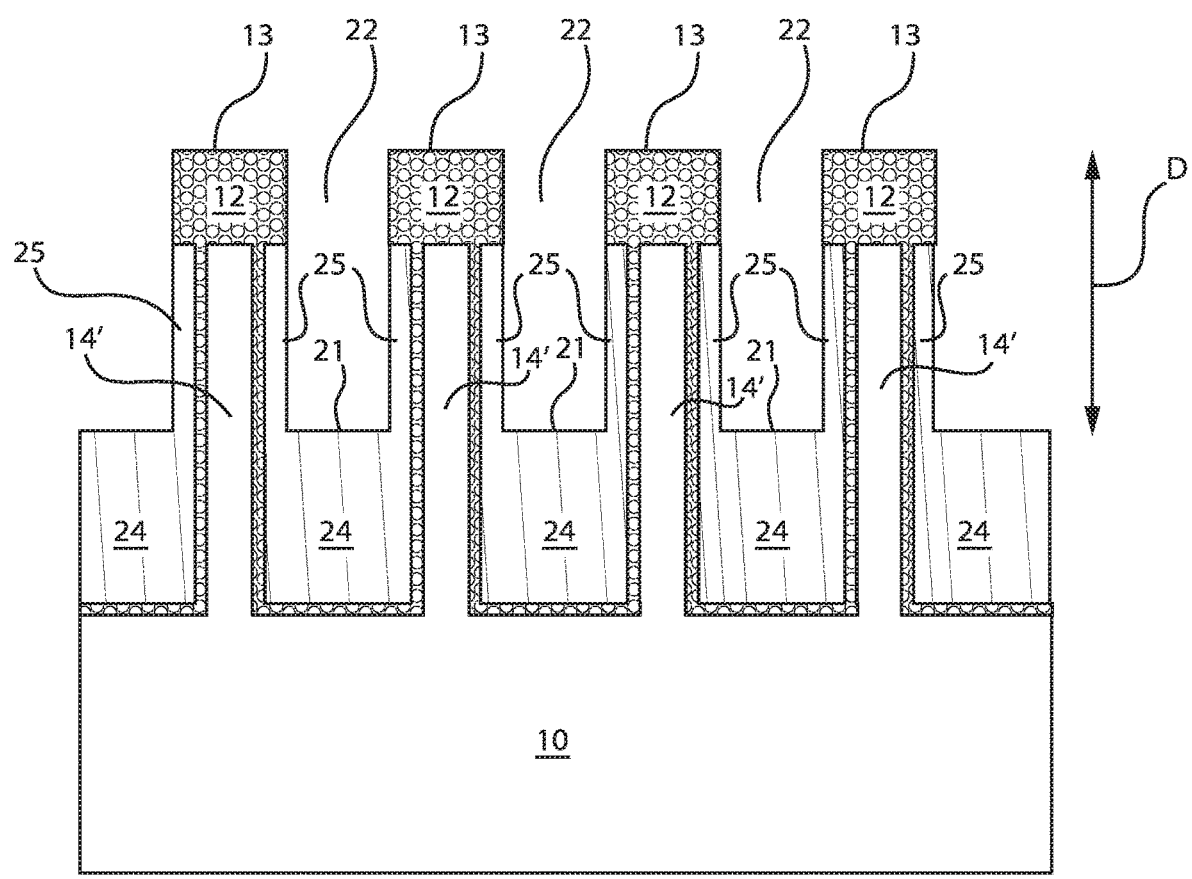
FIG. 6 is a cross-sectional view of the semiconductor structure of FIG. 5 where recesses are created between the plurality of fins via a first etching step (directional etch), in accordance with an embodiment of the present invention.

FIG. 6 is a cross-sectional view of the semiconductor structure of FIG. 5 where recesses are created between the plurality of fins, in accordance with an embodiment of the present invention.

The fin reveal process is performed using a directional etch process (e.g., reactive ion etch (RIE), or an atomic layer etch (ALE). In a particularly useful embodiment, the ALE process includes a quasi-ALE process or a gas/bias pulsing process so that the etch is directional.

The quasi-ALE process cycles between a polymer deposition and etch process. The quasi-ALE process is a gas cycling process. One cycle deposits a polymer, the next cycle uses Ar to activate F inside of the polymer to etch dielectric material (e.g., oxide). The quasi-ALE process provides better etch uniformity on large spaces and tight spaces (e.g., STI). The polymer deposits more on silicon nitride as compared to oxide, so it has selectivity to silicon nitride.

The quasi-ALE process employs a capacitive plasma tool with both gas and bias pulsing. For example, quasi-ALE uses Ar atoms to bomb the polymer deposited to activate fluorine inside of the polymer to react with an oxide layer or material. The polymer will deposit selectively on nitride compared to oxide to achieve higher etch selectivity.

In various exemplary embodiments, the additional dielectric 20 is selectively recessed by a first amount. In a first step of a two-step STI oxide recess, a directional etch takes place that recesses the additional dielectric 20 by a first amount. The first recess 22 results in first STI sections/regions 24 and second STI sections/regions 25 remaining adjacent the fins 14'. The first STI sections 24 remain at a lower section of the fins 14', whereas the second STI sections 25 remain at an upper section of fins 14'. The first STI sections 24 extend from one fin 14' to another fin 14', whereas the second STI sections 25 occupy an area directly underneath the hardmasks 12. The first STI sections 24 have an exposed upper surface 21. The second STI sections 25 have a width equal to the width of an area extending beyond the sidewalls of the dielectric liner 18. The sidewalls of the second STI sections 25 can be flush with the sidewalls of the hardmasks 12. The recess 22 can extend a distance "D" to the top surface 21 of the first STI sections 24.

The width of the hardmask 12 protects or guards the fin 14' because the hardmask 12 acts as an umbrella or shield over the fin 14'. Thus, the corners of the fin 14' are secured or preserved in their initial or original or unmodified or undamaged state (i.e., 90 degree angle, rectangular shape) throughout the manufacturing process and are not rounded or adversely modified in any shape, way or form. Thus, corner erosion or corner rounding can be mitigated or avoided altogether. As a result, geometric integrity of the upper corners of the plurality of fins 14' is maintained throughout the semiconductor manufacturing process due the width differential or thickness differential between the hardmask 12 and the fin 14'.

It is noted that a certain amount of minimal, yet acceptable damage may be present on the surface of the fins. Surface damage can be caused by the constant deposition and removal of various layers to/from the fins. Removal or stripping or etching of deposited layers over the fins can cause slight or negligible damage to the surface of the fins. This damage can be, e.g., much less than 5-10% of the fin surface. In fact, the damage can be much less than 1-5% of the fin surface. Thus, the term "undamaged" may include a subtle or negligible deviation of much less than 1-10% of the fin surface from a starting point in the semiconductor fabrication (e.g., initial formation of fins on substrate) to an ending point of the semiconductor fabrication (e.g., final structure formation; after occurrence of multiple processing steps). Thus, a tiny acceptable range or percentage of negligible damage may, in certain instances, be factored into the term "undamaged."

Figure 7:
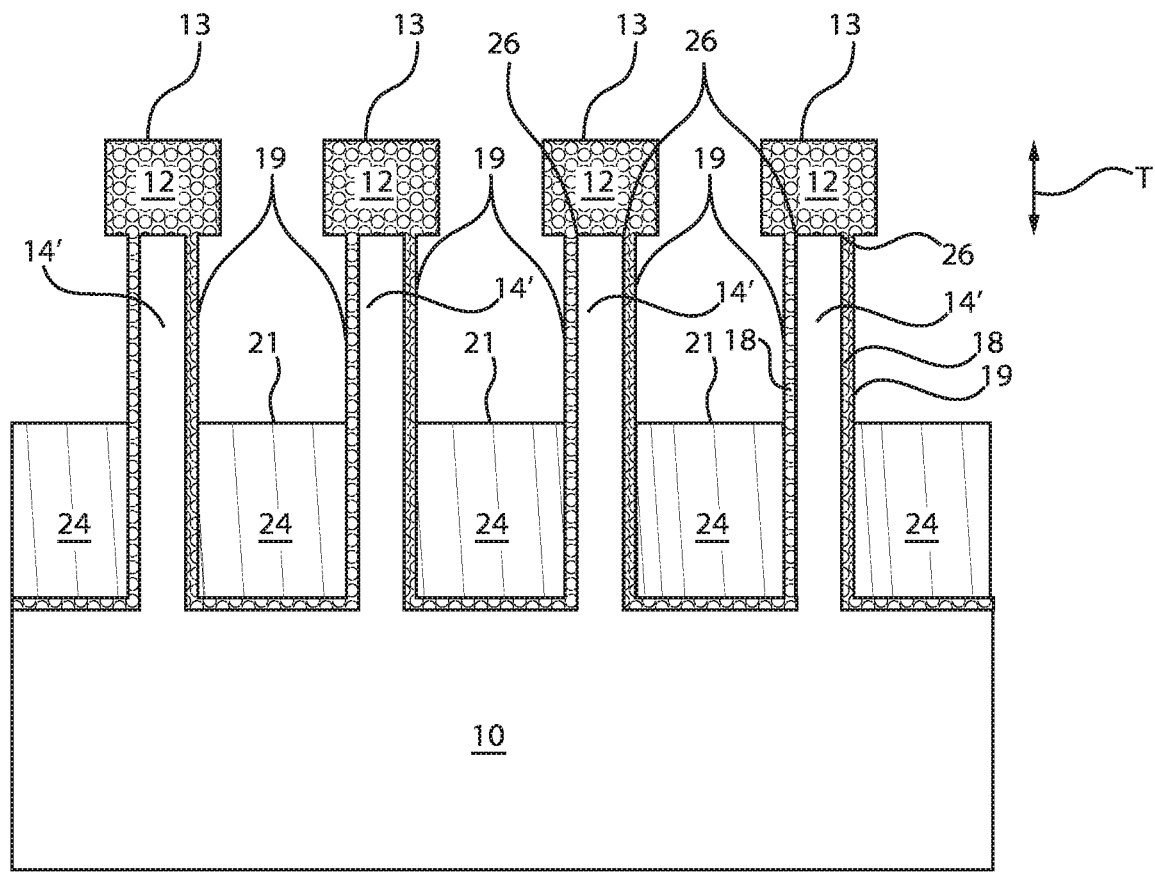
FIG. 7 is a cross-sectional view of the semiconductor structure of FIG. 6 where a second etch (isotropic etch) takes place to remove the dielectric fill adjacent sidewalls of the plurality of fins, in accordance with an embodiment of the present invention.

FIG. 7 is a cross-sectional view of the semiconductor structure of FIG. 6 where an etch takes place to remove the dielectric fill adjacent sidewalls of the plurality of fins, in accordance with an embodiment of the present invention.

In various exemplary embodiments, in a second step of a two-step STI oxide recess, a selective isotropic etch takes place that removes the second STI oxide section 25 formed directly underneath the fin hardmask 12. The removal of the second STI oxide section 25 results in the exposure of side surfaces or sidewalls 19 of dielectric liner 18 if present. Additionally, the bottom surface of the hardmasks 12 is exposed. The thickness "T" of the hardmasks 12 remains substantially intact (strictly speaking some hardmask will be etched depending on the etch selectivity. As long as the majority of the hardmask remains, it serves the purpose of protecting the semiconductor fins). Additionally, the upper corners 26 of the fins 14' remain intact due to the enlarged or expanded thickness "T" and width "W1" of the hardmasks 12. At the $2^{nd}$ step of STI oxide recess, the STI recess is further increased. After the two-step STI oxide recess, the upper corners 26 of the fins 14' remain intact (or "as-is" in their original or initial or unmodified or undamaged state), with no corner erosion taking place due to the fact that the fin hardmask 12 is wider than the fin 14'. In other words, the wider hardmask overshadows (completely protects) the fin from any potential erosion by the first directional recess process. In some embodiments, the isotropic etch is performed by a wet etch process including hydrogen fluoride acid or a chemical oxide etch.

Figure 8:
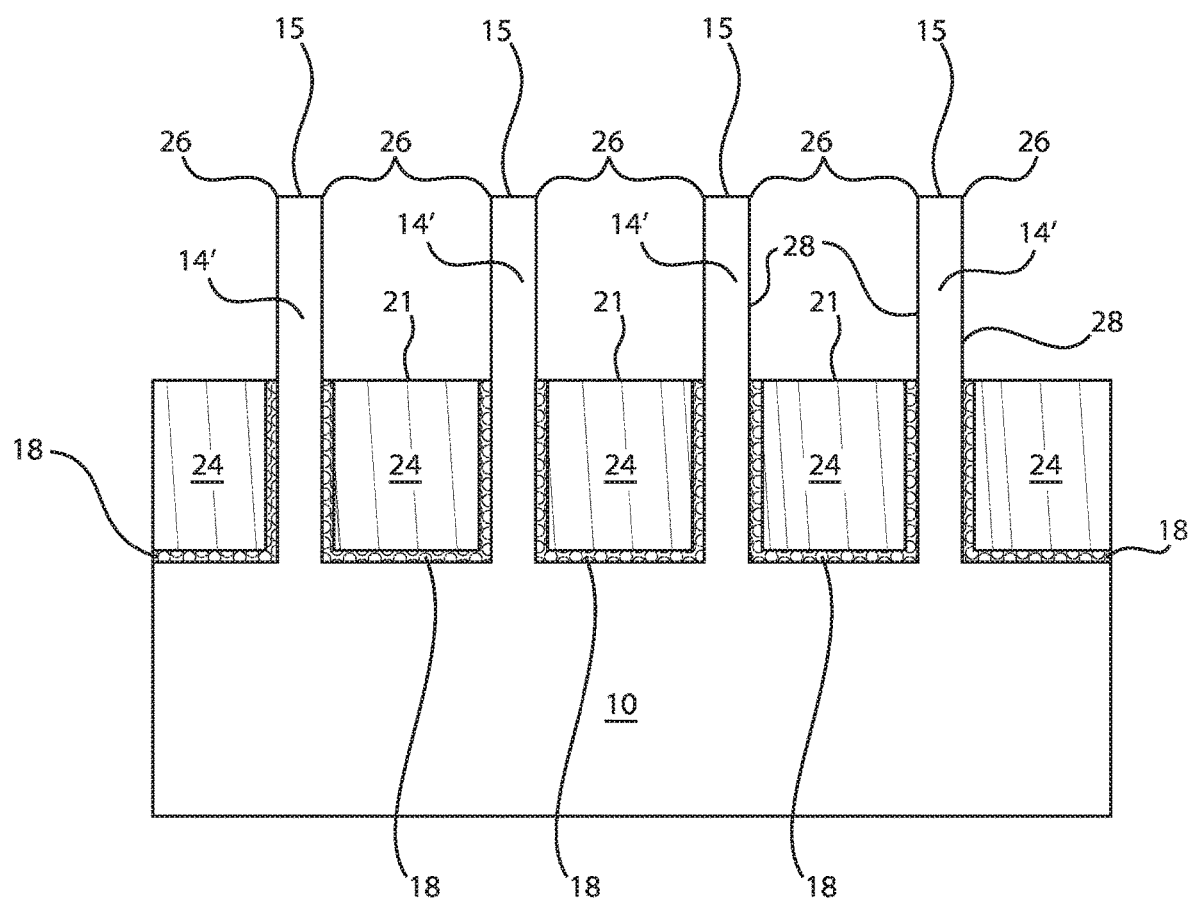
FIG. 8 is a cross-sectional view of the semiconductor structure of FIG. 7 where the fin hardmask and the dielectric liner are removed to expose the plurality of fins, in accordance with an embodiment of the present invention.

FIG. 8 is a cross-sectional view of the semiconductor structure of FIG. 7 where the fin hardmask is removed to expose the plurality of fins, in accordance with an embodiment of the present invention. In some embodiments that include the dielectric liner 18, the exposed dielectric liner can be removed along with the fin hardmask. In some embodiments, the removal process includes performing a wet etch process having phosphoric acid to remove the silicon nitride hardmask and silicon nitride liner. An additional oxide etch process can be performed to remove the additional oxide layer in the original hardmask and liner.

In various exemplary embodiments, the hardmasks 12 and the exposed dielectric liners 18 are selectively removed thus exposing the fins 14'. The top surface 15 of the fins 14' and the sidewalls 28 of the fins are thus exposed. Additionally, the upper corners 26 of the fins 14' remain intact after the removal of the hardmasks 12 and the exposed dielectric liners 18. The height of the fins 14' above the STI oxide section 24 can be, e.g., from about 20 nm to about 100 nm. In a preferred embodiment, the height of the fins 14' above the STI oxide section 24 can be, e.g., from about 40 nm to about 60 nm. Stated differently, this is the height of the exposed fin section.

Figure 9:
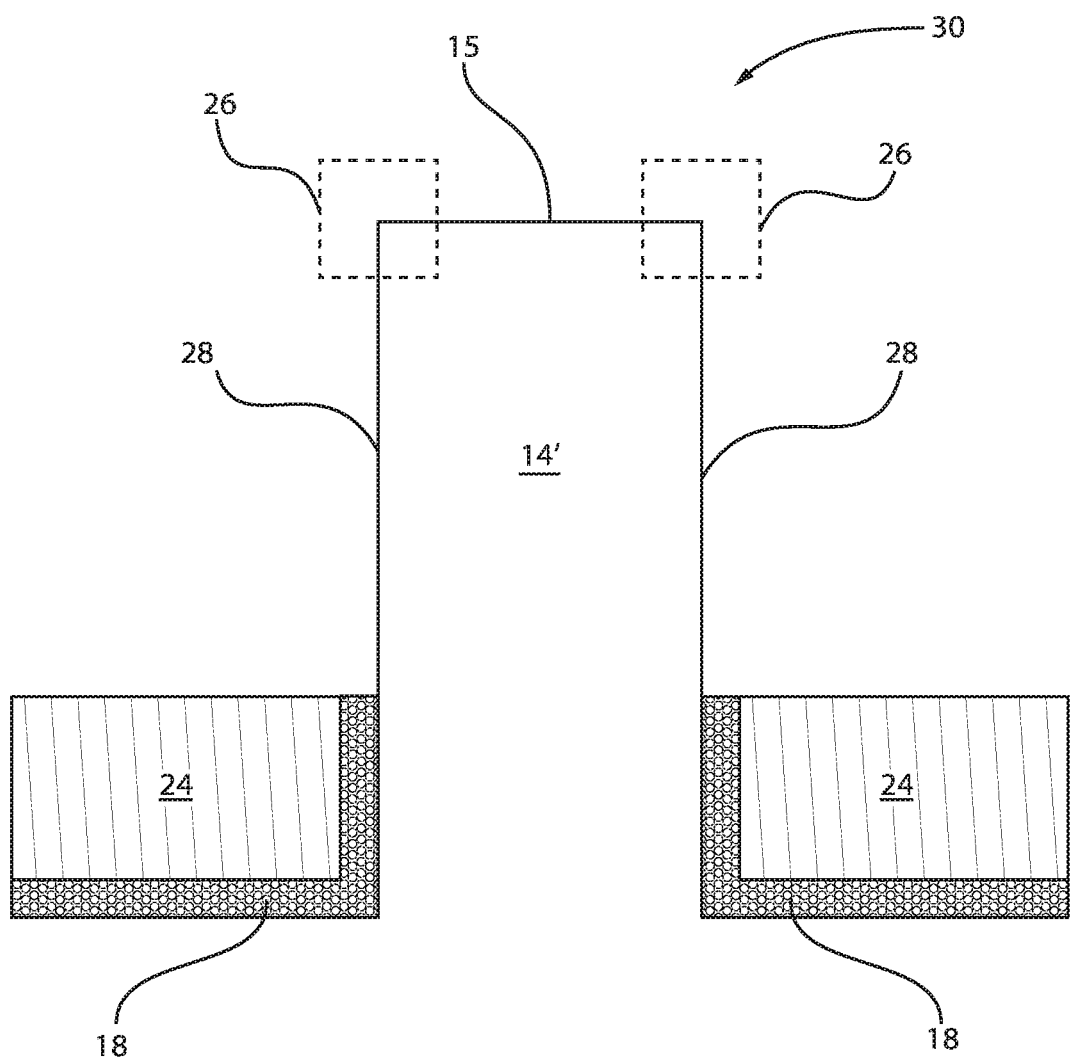
FIG. 9 is an enlarged view of a fin of the semiconductor structure of FIG. 8 illustrating the undamaged or intact corners of the fin, in accordance with an embodiment of the present invention.

FIG. 9 is an enlarged view of a fin of the semiconductor structure of FIG. 8 illustrating the undamaged corners of the fin, in accordance with an embodiment of the present invention.

The enlarged view 30 further indicates that after the two-step STI oxide recess, the upper corners 26 of the fin 14' remain intact, meaning that there is no corner erosion or corner damage. The corners 26 remain at a substantially 90 degree angle or in a substantially rectangular shape. A uniform geometry of the upper corners of the plurality of fins is thus maintained throughout the semiconductor manufacturing processing to form a desired final semiconductor structure.

Prior to the present invention, other etching processes, and reactive ion etch (RIE) processes in particular, applied to such a structure for forming a deep recess for an isolation structure not only caused excessive and unacceptable erosion of the fins but also compromised control of critical dimensions and line edge roughness (irregular or non-ideal corners). Therefore, prior to the present invention, it was not known whether any etch process could be found that could perform the needed etch process to achieve the result of maintaining the rectangular upper corner dimensions of the fins.

It will be helpful in appreciating the effects of the invention in the following discussion to recall that selectivity of etching is generally a function of a difference in etch rates of different materials for a given etchant chemistry. Therefore, factors that tend to slow the etching of the selectively etched material tends to reduce effective selectivity to other materials and that best selectivity will be observed when the etch progresses as rapidly as possible.

Figure 10:
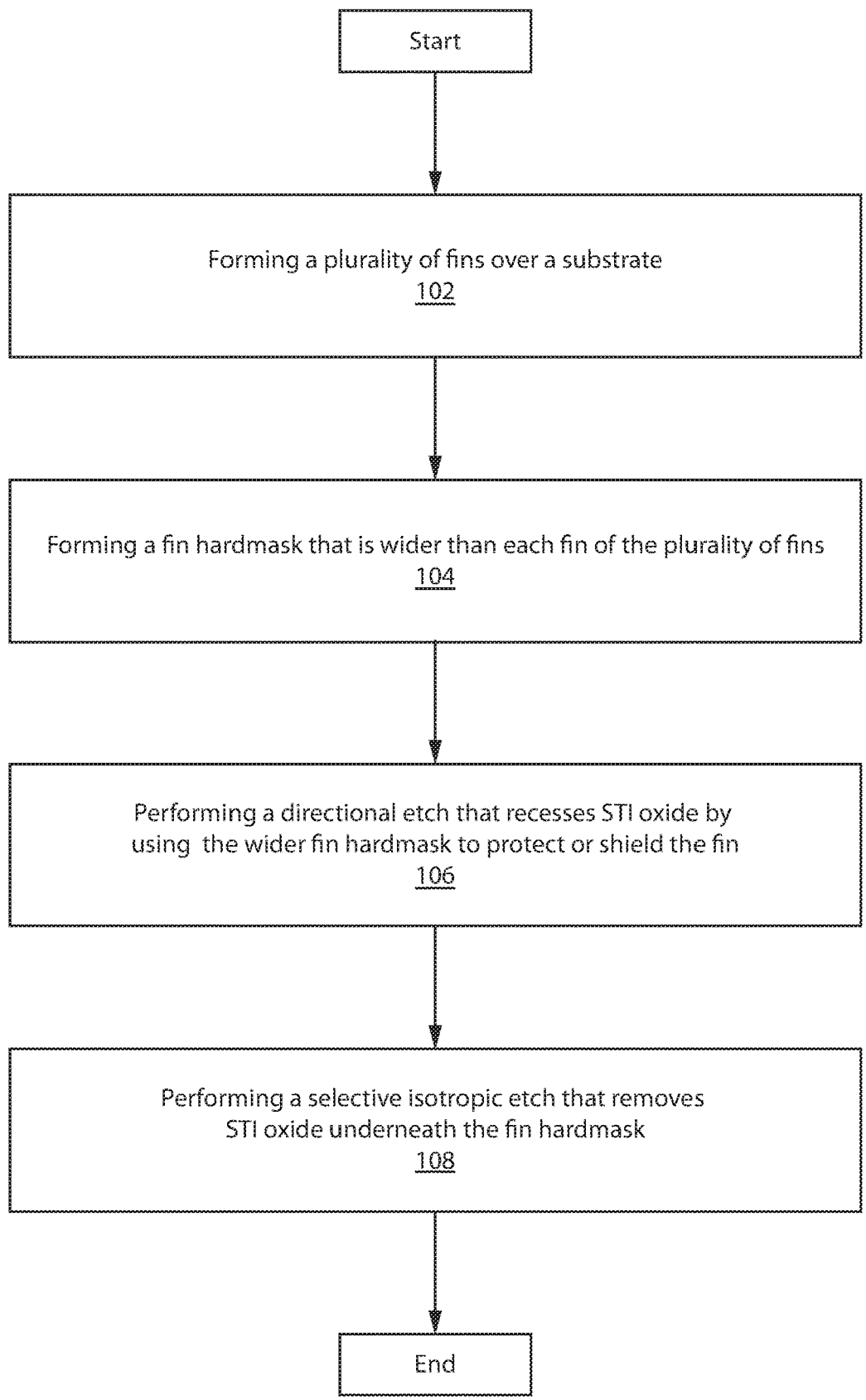
FIG. 10 is a method of avoiding or preventing fin corner erosion, in accordance with an embodiment of the present invention.

FIG. 10 is a method of avoiding fin corner erosion, in accordance with an embodiment of the present invention.

At block 102, a plurality of fins are formed over a semiconductor substrate. The fins are referred to as "fat" fins as they are thicker than the target fins contemplated for the final semiconductor structure. The fins can be, e.g., SiGe fins.

At block 104, a fin hardmask is formed that is wider than each of the plurality of fins. The fin hardmask can be formed from, e.g., SiN. The hardmask is wider than its respective fin.

At block 106, a directional etch is performed that recesses the STI oxide by using the wider fin hardmask to protect or shield the fin. The recess forms two STI regions, one on a lower area of the fin and one on an upper area of the fin. The upper STI region is formed directly underneath the fin hardmask.

At block 108, a selective isotropic etch is performed to remove the STI oxide underneath the fin hardmask. This results in exposing the bottom surface of the hardmask. This also results in the exposure of the dielectric liner covering the sidewalls of the fins. However, the upper corner of the fins remains intact throughout this two-step STI oxide recess.

The dry etch can include a quasi-ALE process to achieve depth uniformity across different fin pitches. The quasi-ALE process includes a plurality of cycles of: depositing a polymer, and etching the polymer and dielectric material (or materials) to achieve the depth uniformity across different fin pitches. The quasi-ALE process includes a plurality of gas and bias pulse cycles of depositing a polymer with embedded etchant and removing the polymer to release the etchant to remove the dielectric material. The quasi-ALE process results in polymer collection on fin side walls and footings (oxide) left on fins adjacent to iso regions. The quasi-ALE process includes a lower lateral etch rate in iso regions as compared with the dense regions.

Regarding FIGS. 1-8, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as required in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for preventing fin corner erosion during semiconductor processing (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for preventing fin erosion during semiconductor processing, the method comprising:
    forming a plurality of hardmasks over a plurality of fin structures;
    trimming the plurality of fin structures such that the plurality of hardmasks are wider than the plurality of fin structures and such that a discernable amount of a bottom surface of the hardmask is exposed;
    forming a dielectric liner adjacent sidewalls of the plurality of trimmed fin structures;
    depositing a dielectric between the plurality of trimmed fin structures;
    etching the dielectric to form recesses between the plurality of trimmed fin structures wherein remaining dielectric portions directly contact the dielectric liner of the plurality of trimmed fin structures and the discernable amount of the bottom surface of the hardmask; and
    isotropically etching the remaining dielectric portions such that upper corners of the plurality of trimmed fin structures remain in an undamaged state.

2. The method of claim 1, wherein the plurality of hardmasks extend beyond each of the sidewalls of the plurality of fin structures by more than about 3 nm.

3. The method of claim 1, wherein the plurality of hardmasks extend beyond sidewalls of the dielectric liner formed adjacent the sidewalls of the plurality of fin structures.

4. The method of claim 1, wherein the dielectric extends a height of the plurality of fin structures.

5. The method of claim 1, wherein the dielectric extends a height of the plurality of hardmasks.

6. The method of claim 1, further comprising removing the plurality of hardmasks to expose the upper corners of the plurality of fin structures.

7. The method of claim 6, further comprising removing exposed portions of the dielectric liner to expose the sidewalls of the plurality of fin structures.

8. The method of claim 1, wherein the undamaged state of the upper corners of the plurality of fin structures is a substantially rectangular state.

9. A method for maintaining geometric integrity of corners of fin structures, the method comprising:
- forming hardmasks over the fin structures, the fin structures trimmed such that the hardmasks are wider than the fin structures and a discernable amount of a bottom surface of the hardmask is exposed;
- directionally etching a dielectric deposited between the trimmed fin structures to form recesses therebetween, the directional etching defining first dielectric regions and second dielectric regions, wherein the second dielectric regions directly contact a dielectric liner of the plurality of trimmed fin structures and the discernable amount of the bottom surface of the hardmask; and
- isotropically etching the second dielectric regions remaining directly underneath the hardmasks such that the corners of the trimmed fin structures remain in an undamaged state.

10. The method of claim 9, wherein the dielectric extends a height of the fin structures.

11. The method of claim 9, wherein the dielectric extends a height of the hardmasks.

12. The method of claim 9, wherein the hardmasks extend beyond each sidewall of the fin structures by more than about 3 nm.

13. The method of claim 9, further comprising forming a dielectric liner adjacent the sidewalls of the fin structures.

14. The method of claim 13, wherein the hardmasks extend beyond sidewalls of the dielectric liner formed adjacent the sidewalls of the fin structures.

15. The method of claim 14, further comprising removing the hardmasks to expose the corners of the fin structures.

16. The method of claim 15, further comprising removing exposed portions of the dielectric liner to expose the sidewalls of the fin structures.

17. The method of claim 9, wherein the undamaged state of the corners of the fin structures is a substantially rectangular state.

18. A method for preventing fin corner erosion during a fin field-effect transistor (FinFET) shallow trench isolation (STI) recess, the method comprising:
- forming hardmasks over fin structures, the fin structures trimmed such that the hardmasks are wider than the fin structures and a discernable amount of a bottom surface of the hardmask is exposed;
- forming a dielectric liner adjacent sidewalls of the trimmed fin structures;
- depositing an STI oxide between the trimmed fin structures;
- directionally etching STI oxide to form recesses between the trimmed fin structures, wherein STI oxide portions directly contact the dielectric liner of the trimmed fin structures and the discernable amount of the bottom surface of the hardmask; and
- isotropically etching the STI oxide portions remaining directly underneath the hardmasks such that upper corners of the trimmed fin structures remain intact.

19. The method of claim 18, further comprising removing the hardmasks to expose the intact upper corners of the fin structures.

20. The method of claim 19, further comprising removing exposed portions of the dielectric liner to expose the sidewalls of the fin structures.

* * * * *